(12) United States Patent
Watanabe

(10) Patent No.: US 7,009,906 B2
(45) Date of Patent: Mar. 7, 2006

(54) SEMICONDUCTOR MEMORY DEVICE HAVING EASILY REDESIGNED MEMORY CAPACITY

(75) Inventor: Naoya Watanabe, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 139 days.

(21) Appl. No.: 10/721,999

(22) Filed: Nov. 26, 2003

(65) Prior Publication Data

US 2004/0151051 A1     Aug. 5, 2004

(30) Foreign Application Priority Data

Feb. 5, 2003    (JP)   ............................. 2003-028670

(51) Int. Cl.
     *G11C 8/00*       (2006.01)

(52) U.S. Cl. ............ 365/230.03; 365/222; 365/230.06; 365/230.01

(58) Field of Classification Search ........... 365/230.03, 365/222, 230.06, 230.01
See application file for complete search history.

(56) References Cited

U.S. PATENT DOCUMENTS

| 4,172,282 A | * | 10/1979 | Aichelmann, Jr. et al. .. 364/200 |
| 6,111,808 A | * | 8/2000 | Khang et al. .......... 365/230.06 |
| 6,538,953 B1 | * | 3/2003 | Hidaka .................. 365/230.03 |
| 6,888,776 B1 | | 5/2005 | Watanabe et al. |

FOREIGN PATENT DOCUMENTS

JP        3-80493      4/1991

* cited by examiner

*Primary Examiner*—Connie C. Yoha
(74) *Attorney, Agent, or Firm*—McDermott Will & Emery LLP

(57) ABSTRACT

Sub-blocks SBA0–SBA3, SBB0–SBB3, SBC0–SBC3, SBD0–SBD3 respectively form four groups. In each group, a refresh end signal REF_END is successively transferred to the next sub-block. Therefore, when a refresh counter of the number of bits corresponding to the number of word lines present in a sub-block is provided in a central control circuit, a memory capacity can easily be redesigned by changing the number of sub-blocks and changing a group configuration of sub-blocks. As a result, there can be provided a memory core for embedded memory in which a memory capacity can easily be changed and a refresh control-related circuitry can easily be changed.

7 Claims, 15 Drawing Sheets

SEMICONDUCTOR MEMORY DEVICE HAVING EASILY REDESIGNED MEMORY CAPACITY

BACKGROUND OF THE INVENTION

1. Field of the Invention

The present invention relates to a semiconductor memory device, and more particularly to a refresh control circuit used for embedded DRAM (Dynamic Random Access Memory) or the like.

2. Description of the Background Art

In DRAM, refresh operations are essential to retain stored data. Japanese Patent Laying-Open No. 3-80493 discloses a memory refresh circuit. This document describes that a refresh end signal of each memory bank serves as a refresh request signal for a bank control circuit at the next stage and the refresh end signal of the memory bank at the last stage is supplied to a refresh request circuit as an acknowledge signal.

In this manner, the refresh operations of the memory banks do not overlap, thereby effectively preventing an error in the system having the memory banks.

Recently, embedded memory has been developed where DRAM and the other large-scale logic circuit or a microprocessor are merged. In this embedded memory, the refresh operation is also required. Unlike a general-purpose DRAM, the embedded memory, however, contains a memory core having a variable memory capacity to support a variety of systems in use.

A region including a memory cell region sandwiched between two sense amplifier bands and a control circuit controlling the memory cell region is called a sub-block. Embedded memory is designed by arranging a necessary number of sub-blocks in accordance with a required memory capacity.

Therefore, the address bit corresponding to a sub-block address is changed each time the number of sub-blocks is changed, and thus the number of bits of a refresh address counter has to be changed. Furthermore, a more complicated change has to be made to the refresh address counter to support the memory capacity where the number of sub-blocks and the total number of word lines is not the power of two.

SUMMARY OF THE INVENTION

An object of the present invention is to provide a semiconductor memory device having a configuration to allow a memory capacity to be easily redesigned.

A semiconductor memory device in accordance with one aspect of the present invention includes a plurality of memory banks having rows that can be activated independently of each other. Where N is a natural number equal to or greater than two and M is a natural number equal to or greater than two and equal to or smaller than N−1, a first memory bank of a plurality of memory banks includes first to N-th sub-memory blocks. An M-th sub-memory block of the first to N-th sub-memory blocks includes a first memory cell array including a plurality of memory cells arranged in rows and columns, and a first local control circuit, in a refresh mode, starting an operation of successively selecting rows of the first memory cell array in response to a first refresh end signal received from an (M−1)th sub-memory block and instructing a refresh start to an (M+1)th sub-memory block when the operation of successively selecting rows ends. The first memory bank further includes a plurality of sense amplifier bands each shared by adjacent two of the first to N-th sub-memory blocks.

A semiconductor memory device in accordance with another aspect of the present invention includes a first memory block. The first memory block includes a plurality of sub-memory blocks being refreshed in a circulating manner in a refresh mode. Each of a plurality of sub-memory blocks includes a memory cell array including a plurality of memory cells arranged in rows and columns, and a local control circuit performing an operation of successively selecting rows of the memory cell array in response to an end of a refresh operation in a sub-memory block at a previous stage which precedes by one in refresh-circulating order, in each of a plurality of sub-memory blocks. A refresh cycle period in each of a plurality of memory blocks is determined depending on the number of the sub-memory blocks included in that memory block.

In accordance with the present invention, therefore, there can be provided a semiconductor memory device where a memory capacity can easily be redesigned and the number of bits of a refresh counter can be reduced with a reduced circuit area.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
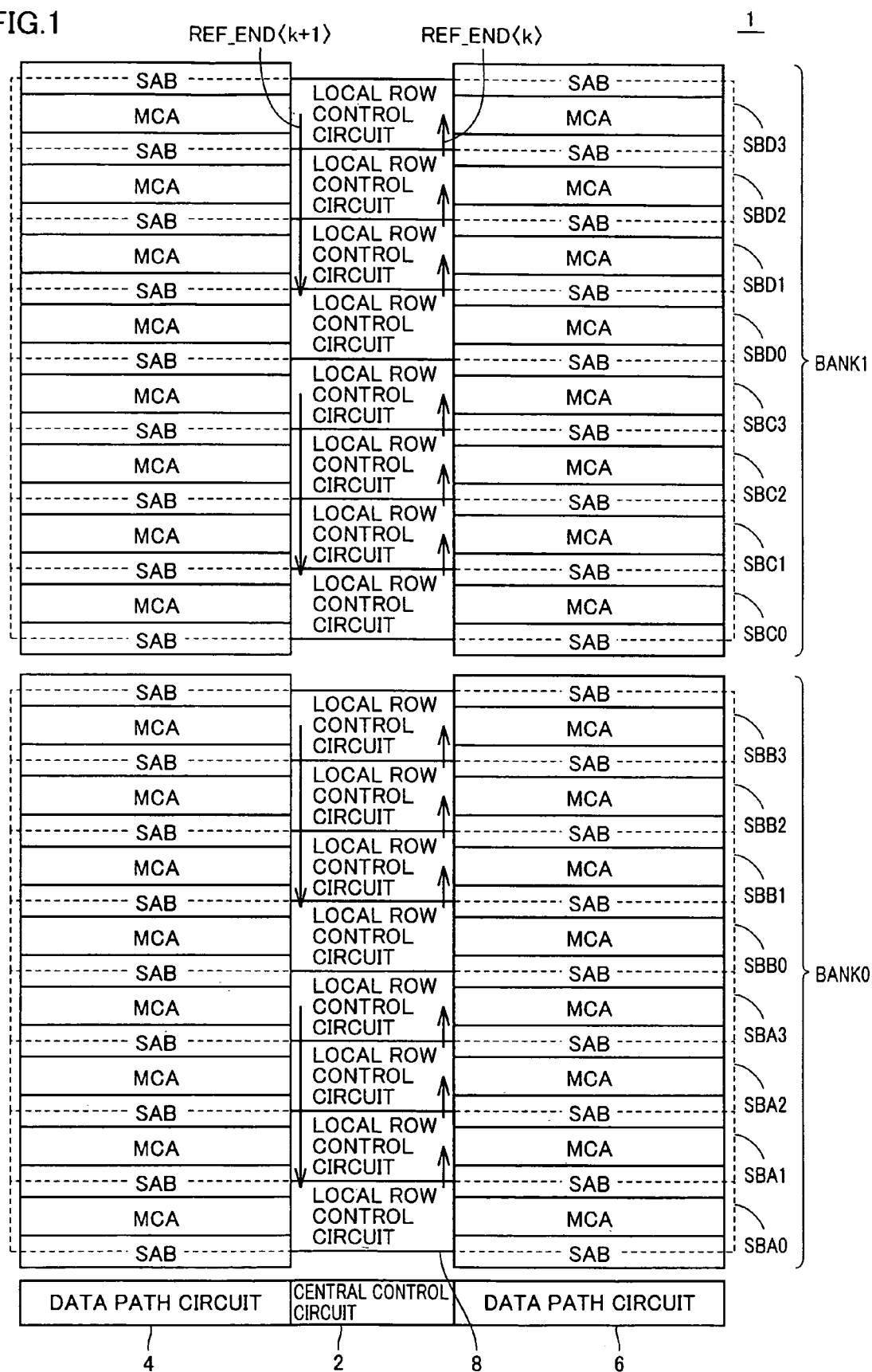
FIG. 1 is a block diagram showing a configuration of a semiconductor memory device in accordance with an embodiment of the present invention.

In the following, the embodiments of the present invention will be described in detail with reference to the figures. It is noted that the same reference characters will be denoted with the same or corresponding parts in the figures.

[First Embodiment]

FIG. 1 is a block diagram showing a configuration of a semiconductor memory device in accordance with an embodiment of the present invention.

Referring to FIG. 1, an embedded memory core 1 configured with two banks will be described. Memory core 1 includes a central control circuit 2, data path circuits 4, 6, and memory banks BANK0, BANK1. Each of data path circuits 4, 6 is a circuit performing data control in reading and writing.

Each memory bank includes eight sub-blocks. Specifically, bank BANK0 includes sub-blocks SBA0–SBA3, SBB0–SBB3. Memory bank BANK1 includes sub-blocks SBC0–SBC3, SBD0–SBD3. Sub-blocks SBA0–SBA3 are arranged in order. Sub-blocks SBB0–SBB3 are arranged in order. Sub-blocks SBD0–SBD3 are arranged in order.

Each sub-block includes one local row control circuit 8 and two memory cell arrays MCA arranged on opposite sides thereof. A sense amplifier band SAB is arranged between a memory cell array MCA and a memory cell array included in the adjacent sub-block. In other words, a sub-block refers to a portion sandwiched between two sense amplifier bands in segmented memory arrays in a bank.

In a configuration with a refresh cycle of 2048 with 512 words lines in a sub-block, for example, in accordance with the present invention, a refresh end signal indicative of the end of refresh in each sub-block loops in a unit of four sub-blocks.

More specifically, sub-blocks SBA0–SBA3 form one group in which a refresh end signal REF_END is successively transferred. Similarly, sub-blocks SBB0–SBB3 form one group in which a loop is formed for successively transferring a corresponding refresh end signal.

Sub-blocks SBC0–SBC3 form one group in which a corresponding refresh end signal is successively transferred. Similarly, sub-blocks SBD0–SBD3 form one group in which a loop is formed for successively transferring a corresponding refresh end signal.

In other words, sub-blocks SBA0–SBA3, SBB0–SBB3, SBC0–SBC3 and SBD0–SBD3 respectively form four groups. In each group, refresh end signal REF_END is successively transferred to the next sub-block. Therefore, using a refresh counter of the number of bits corresponding to the number of word lines present in a sub-block, a memory capacity can easily be redesigned by changing the number of sub-blocks and changing a group configuration of the sub-blocks. Thus, a memory core for embedded memory can be realized in which a memory capacity and a refresh control-related circuit can easily be changed.

Figure 2:
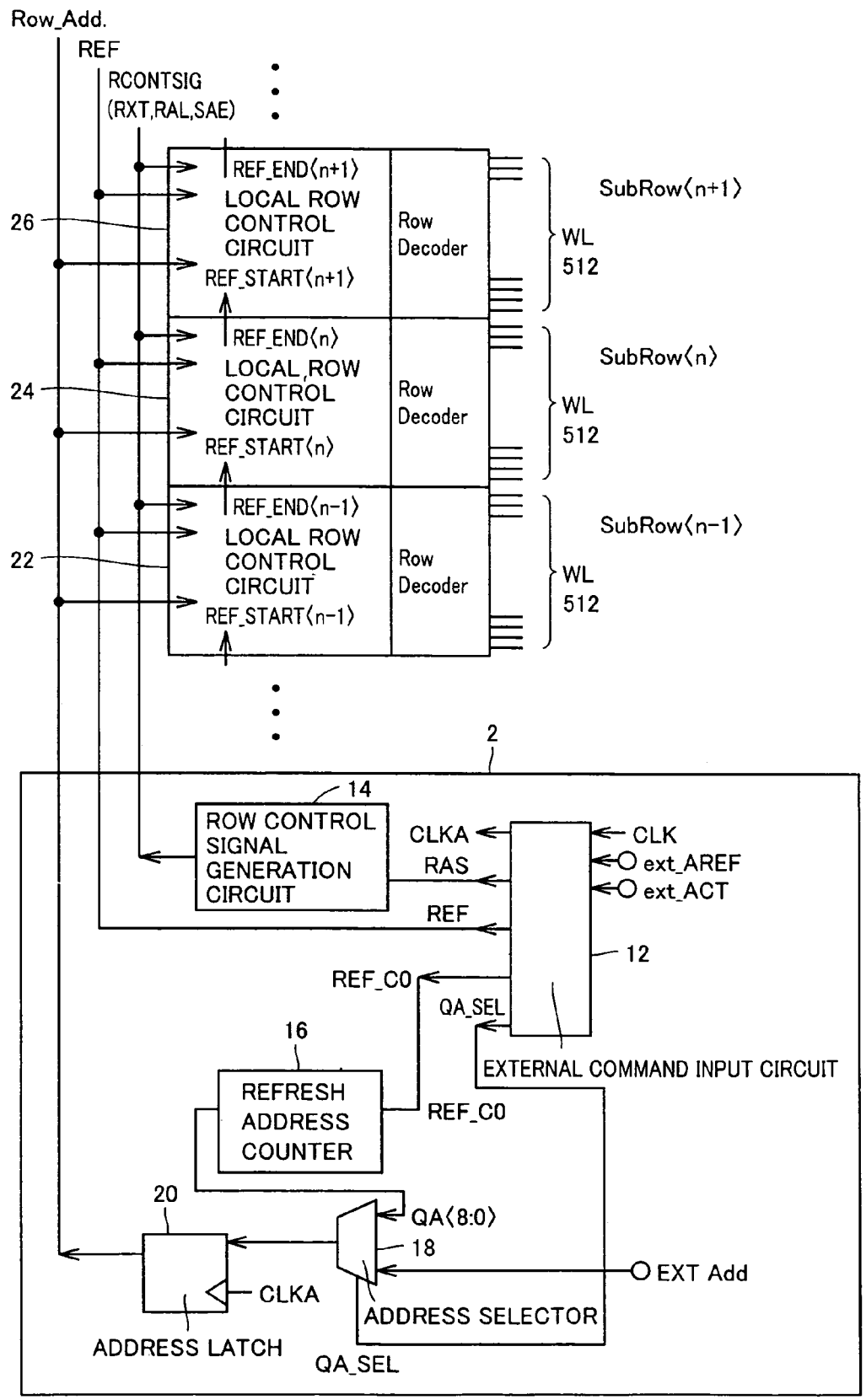
FIG. 2 is a circuit diagram showing a configuration of a central control circuit in FIG. 1.

FIG. 2 is a circuit diagram showing a configuration of the central control circuit in FIG. 1.

Referring to FIG. 2, central control circuit 2 includes an external command input circuit 12, a row control signal generation circuit 14, a refresh address counter 16, an address selector 18, and an address latch 20.

External command input circuit 12 receives a clock signal CLK and signals ext_AREF, ext_ACT to output a clock signal CLKA and signals RAS, REF, REF_CO, QA_SEL. Row control signal generation circuit 14 receives signal RAS to output a row-related control signal RCONTSIG including signals RXT, RAL and SAE. Refresh address counter 16 receives signal REF_CO to output a refresh address QA<8:0>. Address selector 18 outputs one of an external address EXTAdd and refresh address QA<8:0> to address latch 20 in response to signal QA_SEL.

Address latch 20 takes in an address provided from address selector 18 to output a row address signal Row_Add in accordance with clock signal CLKA. Row address signal Row_Add, signal REF and row-related control signal RCONTSIG are provided in common to local row control circuits 22, 24, 26 included in (n−1)th, nth, (n+1)th sub-blocks, respectively, through an address bus or a control signal bus.

Each of local row control circuits 22, 24, 26 includes a row decoder for selecting 512 word lines WL. A refresh address counter 16 is formed of a nine-bit increment counter, as described later with reference to FIG. 6, as there are 512 word lines in a sub-block.

Figure 3:
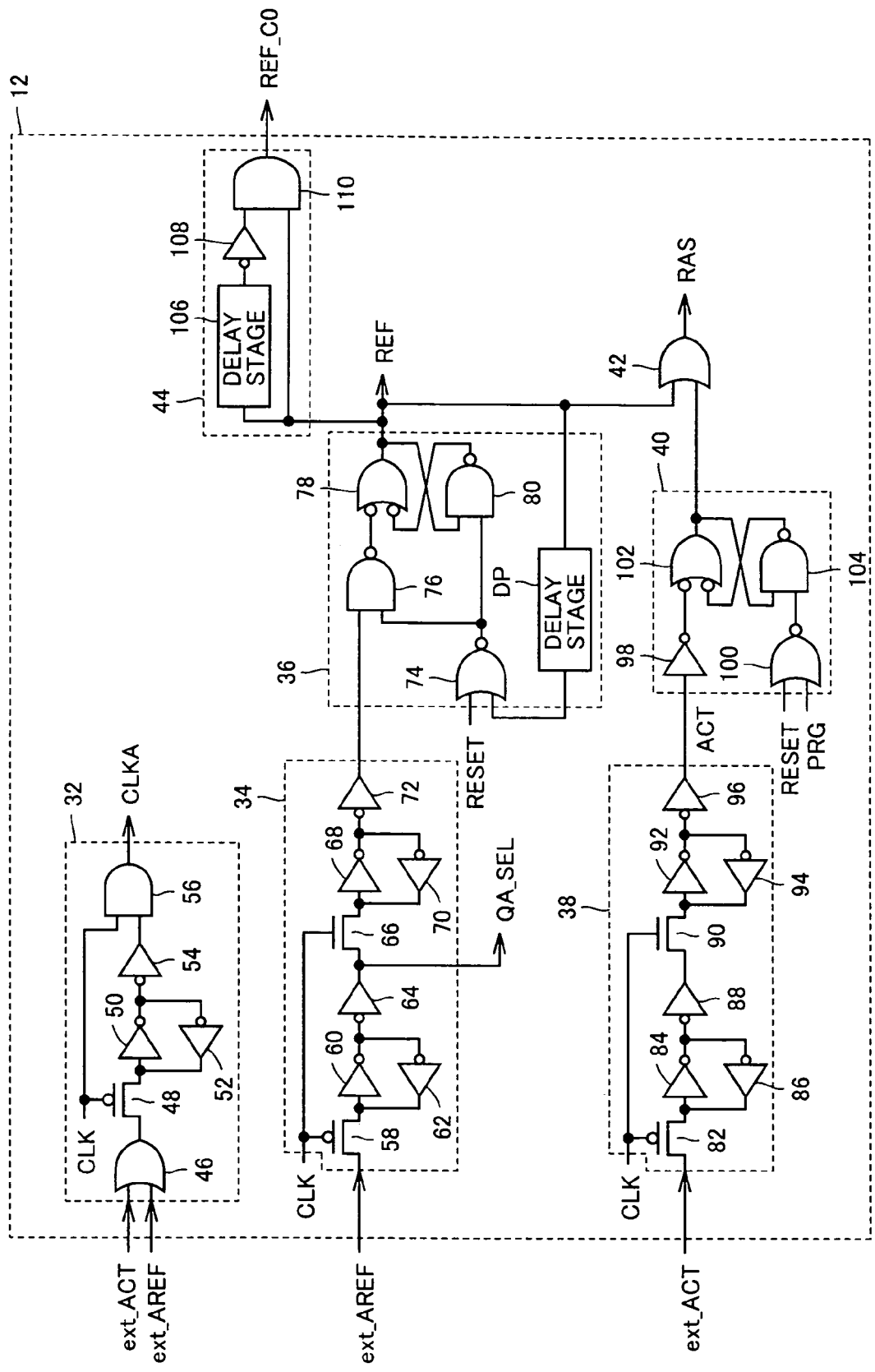
FIG. 3 is a circuit diagram showing a configuration of an external command input circuit in FIG. 2.

FIG. 3 is a circuit diagram showing a configuration of the external command input circuit in FIG. 2.

Referring to FIG. 3, external command input circuit 12 includes an internal clock generation circuit 32 outputting clock signal CLKA as an internal clock in response to signals ext_ACT, ext_AREF and clock signal CLK, a flip-flop circuit 34 taking in signal ext_AREF in response to clock signal CLK, and a flip-flop circuit 38 taking in signal ext_ACT in response to clock signal CLK to output signal ACT.

External command input circuit 12 further includes a latch circuit 36 receiving the output of flip-flop circuit 34, a latch circuit 40 receiving the output of a flip-flop circuit 38, an OR circuit 42 receiving the outputs of latch circuits 36 and 40 to output signal RAS, and a clock output circuit 44 outputting clock signal REF_CO in response to signal REF output by latch circuit 36.

Internal clock generation circuit 32 includes an OR circuit 46 receiving signals ext_ACT, ext_AREF, a P-channel MOS transistor 48 receiving clock signal CLK at its gate for transmitting the output of OR circuit 46, an inverter 50 receiving and inverting the output of OR circuit 46 through P-channel MOS transistor 48, an inverter 52 receiving and inverting the output of inverter 50 for application to the input of inverter 50, an inverter 54 receiving and inverting the output of inverter 50, and an AND circuit 56 receiving clock signal CLK and the output of inverter 54 to output clock signal CLKA.

Flip-flop circuit 34 includes a P-channel MOS transistor 58 receiving clock signal CLK at its gate for taking in signal ext_AREF, an inverter 60 receiving and inverting signal ext_AREF through P-channel MOS transistor 58, an inverter 62 receiving and inverting the output of inverter 60 for application to the input node of inverter 60, and an inverter 64 receiving and inverting the output of inverter 60. Inverter 64 outputs a signal QA_SEL.

Flip-flop circuit 34 further includes an N-channel MOS transistor 66 receiving clock signal CLK at its gate for transmitting the output of inverter 64, an inverter 68 receiving and inverting the output of inverter 64 through N-channel MOS transistor 66, an inverter 70 receiving and inverting the output of inverter 68 for application to the input node of inverter 68, and an inverter 72 receiving and inverting the output of inverter 68.

Flip-flop circuit 38 includes a P-channel MOS transistor 82 receiving clock signal CLK at its gate for taking in signal ext_ACT, an inverter 84 receiving and inverting signal ext_AREF through P-channel MOS transistor 82, an inverter 86 receiving and inverting the output of inverter 84 for application to the input node of inverter 84, and an inverter 88 receiving and inverting the output of inverter 84.

Flip-flop circuit 38 further includes an N-channel MOS transistor 90 receiving clock signal CLK at its gate for transmitting the output of inverter 88, an inverter 92 receiving and inverting the output of inverter 88 through N-channel MOS transistor 90, an inverter 94 receiving and inverting the output of inverter 92 for application to the input node of inverter 92, and an inverter 96 receiving and inverting the output of inverter 92.

Latch circuit 36 includes a delay stage DP receiving signal REF at a delay time TP, an NOR circuit 74 receiving the output of delay stage DP and a signal RESET, and an NAND circuit 76 receiving the output of NOR circuit 74 and the output of inverter 72.

Latch circuit 36 further includes an NAND circuit 78 receiving the output of NAND circuit 76 at its one input to output signal REF, and an NAND circuit 80 receiving signal REF and the output of NOR circuit 74. The output of NAND circuit 80 is applied to the other input of NAND circuit 78.

Latch circuit 40 includes an NOR circuit 100 receiving signal RESET and signal PRC, an inverter 98 receiving and inverting signal ACT, an NAND circuit 102 receiving the output of inverter 98 at its one input, and an NAND circuit 104 receiving the output of NAND circuit 102 and the output of NOR circuit 100. The output of NAND circuit 104 is applied to the other input of NAND circuit 102. Furthermore, the output of NAND circuit 102 is applied to the one input of OR circuit 42.

Clock output circuit 44 includes a delay stage 106 receiving signal REF, an inverter 108 receiving and inverting the output of delay stage 106, and an NAND circuit 110 receiving the output of inverter 108 and signal REF to output signal REF_CO. Signal REF_CO is used as a trigger clock of counter increment for generating a refresh address.

Figure 4:
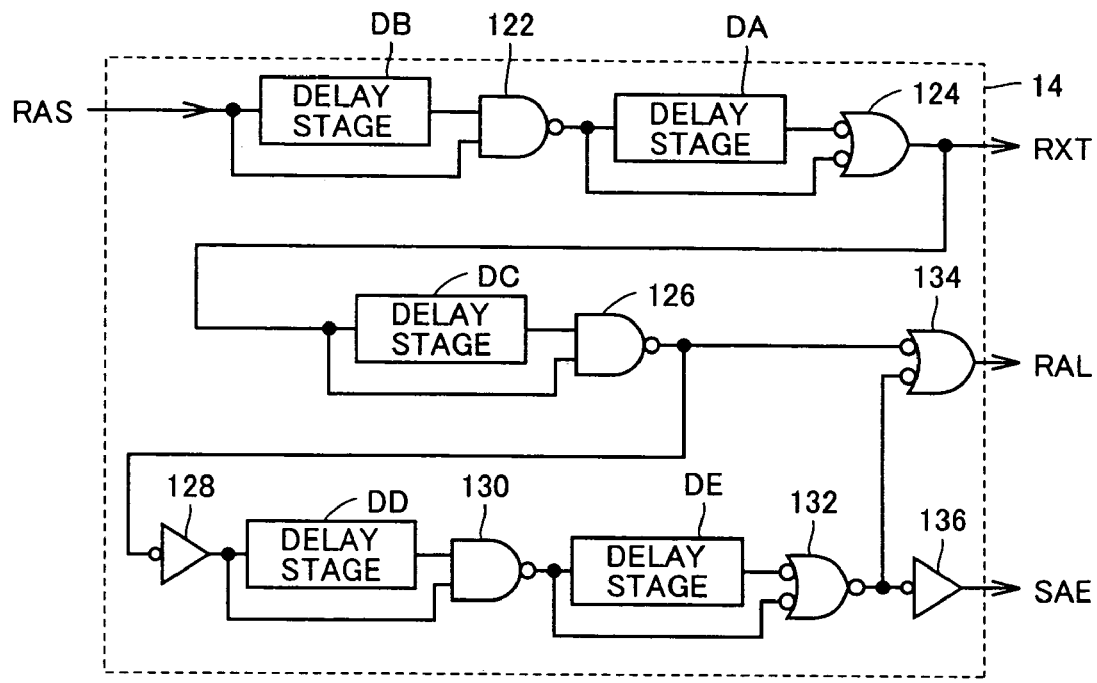
FIG. 4 is a circuit diagram showing a configuration of a row control signal generation circuit 14 in FIG. 2.

FIG. 4 is a circuit diagram showing a configuration of row control signal generation circuit 14 of FIG. 2.

Referring to FIG. 4, row control signal generation circuit 14 includes a delay stage DB receiving and delaying signal RAS in a delay time TB, an NAND circuit 122 receiving the output of delay stage DB and signal RAS, a delay stage DA receiving and delaying the output of AND circuit 122 in a delay time TA, an NAND circuit 124 receiving the output of delay stage DA and the output of NAND circuit 122 to output signal RXT, a delay stage DC receiving and delaying signal RXT in a delay time TC, and an NAND circuit 126 receiving signal RXT and the output of delay stage DC.

Row control signal generation circuit 14 further includes an inverter 128 receiving and inverting the output of NAND circuit 126, a delay stage DD delaying the output of inverter 128 in a delay time TD, an NAND circuit 130 receiving the output of delay stage DD and the output of inverter 128, a delay stage DE delaying the output of NAND circuit 130 in a delay time TE, an AND circuit 132 receiving the output of delay stage DE and the output of NAND circuit 130, an inverter 136 receiving and inverting the output of AND circuit 132 to output signal SAE, and an NAND circuit 134 receiving the output of AND circuit 132 and the output of NAND circuit 126 to output signal RAL.

Figure 5:
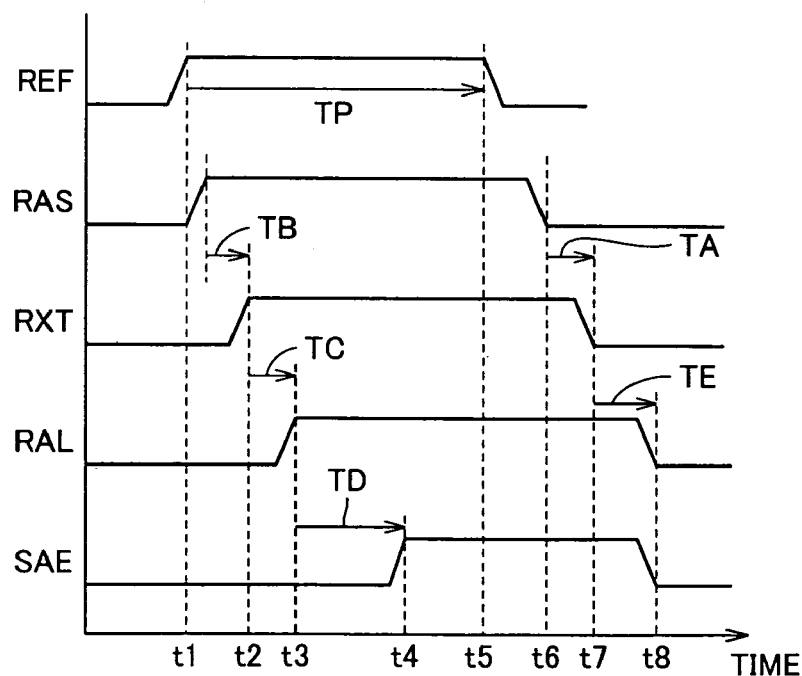
FIG. 5 is an operational waveform diagram illustrating an operation of the row control signal generation circuit in FIG. 4.

FIG. 5 is an operational waveform diagram illustrating an operation of the row control signal generation circuit shown in FIG. 4.

Referring to FIG. 5, signal REF rises from L (low) level to H (high) level at time t1. Signal RAS then rises in response to a change in the input of OR circuit 42 in FIG. 3. Signal RXT rises from L level to H level at time t2 after delay time TB of delay stage DB in FIG. 4 from the rising of signal RAS.

At time t3 after delay time TC of delay stage DC from time t2, signal RAL rises from L level to H level. At time t4 after delay time TD of delay stage DD from time t3, signal SAE rises from L level to H level.

Signal REF rising at time t1 falls from H level to L level at time t5 after delay time TP of delay stage DP in FIG. 3. Then, when signal RAS rises from H level to L level at time t6, signal RXT falls from H level to L level at time t7 after the delay time of delay stage DA from time t6. At time t8 after delay time TE of delay stage DE from time t7, signals RAL and SAE fall from H level to L level.

Figure 6:
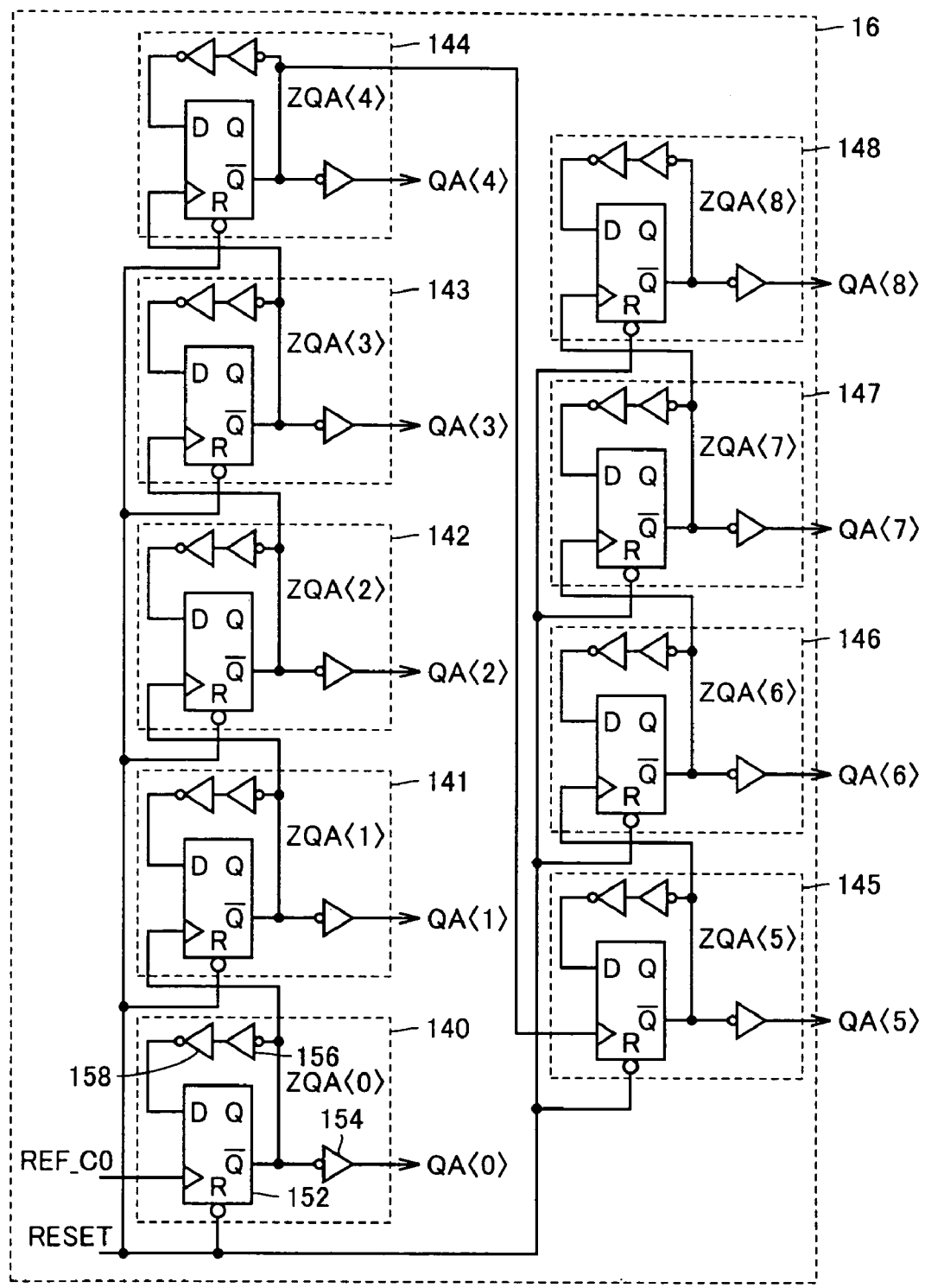
FIG. 6 is a circuit diagram showing a configuration of a refresh address counter in FIG. 2.

FIG. 6 is a circuit diagram showing a configuration of the refresh address counter in FIG. 2.

Referring to FIG. 6, refresh address counter 16 is a nine-bit increment counter that is initialized by signal RESET and increments signals QA<0>–QA<8> in response to clock signal REF_CO. Refresh address counter 16 includes counter stages 140–148 corresponding to bits QA<0>–QA<8>, respectively.

First counter stage 140 includes a D flip-flop circuit 152 reset when reset signal RESET is at L level and receiving signal REF_CO as a clock input, an inverter 154 receiving and inverting an inversion Q output of D flip-flop 152 to output signal QA<0>, and two-stage inverters 156, 158 connected in series for receiving a signal ZQA<0> output from the inversion Q output of D flip-flop 152. The output of inverter 158 is applied to the D input of D flip-flop circuit 152.

The configuration of each of counter stages 141–148 is similar to that of counter stage 140 and therefore description thereof will not be repeated. Note that counter stage 140 receives signal REF_CO as a clock input of the D flip-flop circuit, whereas in each of counter stages 141–148, the inversion Q output of the D flip-flop circuit at the previous counter state is applied as a clock input of the D flip-flop circuit.

Figure 7:
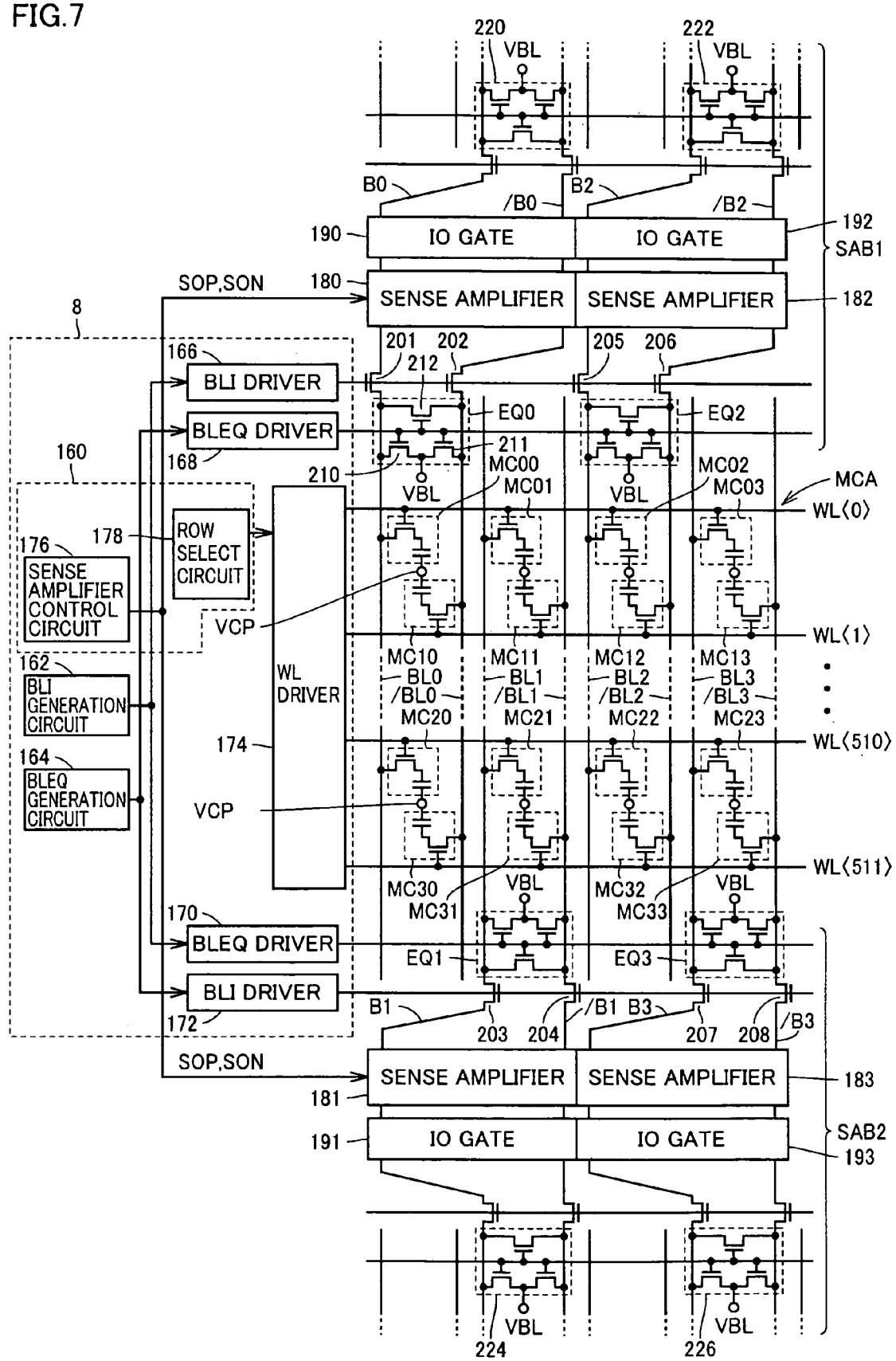
FIG. 7 is a circuit diagram illustrating a configuration of a local row control circuit, a sense amplifier band and a memory cell array in FIG. 1.

FIG. 7 is a circuit diagram illustrating a configuration of the local row control circuit, the sense amplifier band and the memory cell array in FIG. 1.

Referring to FIG. 7, memory cell array MCA includes memory cells MC00–MC33.

Memory cell MC00 is connected to word line WL<0> and bit line BL0, and memory cell MC01 is connected to word line WL<0> and bit line BL1. Memory cell MC02 is connected to word line WL<0> and bit line BL2, and memory cell MC03 is connected to word line WL<0> and bit line BL3.

Memory cell MC10 is connected to word line WL<1> and bit line /BL0, and memory cell MC11 is connected to word line WL<1> and bit line /BL1. Memory cell MC12 is connected to word line WL<1> and bit line /BL2, and memory cell MC13 is connected to word line WL<1> and bit line /BL3.

Memory cell MC20 is connected to word line WL<510> and bit line BL0, and memory cell MC21 is connected to word line WL<510> and bit line BL1. Memory cell MC22 is connected to word line WL<510> and bit line BL2, and memory cell MC23 is connected to word line WL<510> and bit line BL3.

Memory cell MC30 is connected to word line WL<511> and bit line /BL0, and memory cell MC31 is connected to word line WL<511> and bit line /BL1. Memory cell MC32 is connected to word line WL<511> and bit line /BL2, and memory cell MC33 is connected to word line WL<511> and bit line /BL3.

Each memory cell includes an access transistor and a memory capacitor connected in series between a corresponding bit line and a cell plate. The gate of the access transistor is connected to a corresponding word line.

Local row control circuit 8 includes a control portion 160 performing sense amplifier control and row selection of memory cells, a BLI generation circuit 162 performing isolation control between a shared sense amplifier band and a bit line, and BLI drivers 166, 172 controlling the gate isolating a sense amplifier from a bit line in accordance with an output of BLI generation circuit 162.

Local row control circuit 8 further includes a BLEQ generation circuit 164 controlling equalization of bit lines, BLEQ drivers 168, 170 driving an equalize signal for bit lines in accordance with the output of BLEQ generation circuit 164, and a WL driver 174 driving word lines WL<0>–WL<511>.

Control portion 160 includes a sense amplifier control circuit 176 outputting signals SOP, SON as sense amplifier control signals, and a row select circuit 178 performing activation control of WL driver 174.

Sense amplifier band SAB1 includes an equalize circuit EQ0 equalizing bit lines BL0 and /BL0, an N-channel MOS transistor 201 connected between bit line BL0 and bit line B0 for receiving the output of BLI driver 166 at its gate, and an N-channel MOS transistor 202 connected between bit line /BL0 and bit line /BL0 for receiving the output of BLI driver 166 at its gate.

Sense amplifier band SAB1 further includes a sense amplifier 180 amplifying a potential difference caused between bit line B0 and bit line /B0 in response to signals SOP, SON, and an IO gate 190 for outputting a signal amplified by sense amplifier 180 to a not-shown IO line.

Sense amplifier band SAB1 further includes an equalize circuit EQ2 equalizing bit lines BL2 and /BL2, an N-channel MOS transistor 205 connected between bit line BL2 and bit line BL2 for receiving the output of BLI driver 166 at its gate, and an N-channel MOS transistor 206 connected between bit line /BL2 and bit line /B2 for receiving the output of BLI driver 166 at its gate.

Sense amplifier band SAB1 further includes a sense amplifier 182 amplifying a potential difference caused between bit line B2 and bit line /B2 in response to signals SOP, SON, and an IO gate 192 for outputting a signal amplified by sense amplifier 182 to a not-shown IO line.

Sense amplifier band SAB2 includes an equalize circuit EQ 1 equalizing bit lines BL1 and /BL1, an N-channel MOS transistor 203 connected between bit line BL1 and bit line B1 for receiving the output of BLI driver 172 at its gate, and an N-channel MOS transistor 204 connected between bit line /BL1 and bit line /BL1 for receiving the output of BLI driver 172 at its gate.

Sense amplifier band SAB2 further includes a sense amplifier 181 amplifying a potential difference caused between bit line B1 and bit line /B1 in response to signals SOP, SON, and an IO gate 191 for outputting a signal amplified by sense amplifier 181 to a not-shown IO line.

Sense amplifier band SAB2 further includes an equalize circuit EQ3 equalizing bit lines BL3 and /BL3, an N-channel MOS transistor 207 connected between bit line BL3 and bit line B3 for receiving the output of BLI driver 172 at its gate, and an N-channel MOS transistor 208 connected between bit line /BL3 and bit line /B3 for receiving the output of BLI driver 172 at its gate.

Sense amplifier band SAB2 further includes a sense amplifier 183 amplifying a potential difference caused between bit line B3 and bit line /B3 in response to signals SOP, SON, and an IO gate 193 for outputting a signal amplified by sense amplifier 183 to a not-shown IO line.

Equalize circuit EQ0 includes an N-channel MOS transistor 212 connected between bit line BL0 and bit line /BL0 for receiving the output of BLEQ driver 168 at its gate, an N-channel MOS transistor 210 rendered conductive in response to the output of BLEQ driver 168 for coupling bit line BL0 to a potential VBL, and an N-channel MOS transistor 211 coupling bit line /BL0 to potential VBL in response to the output of BLEQ driver 168. The configuration of each of equalize circuits EQ1-EQ3 is similar to that of equalize circuit EQ0 and description thereof will not be repeated.

Figure 8:
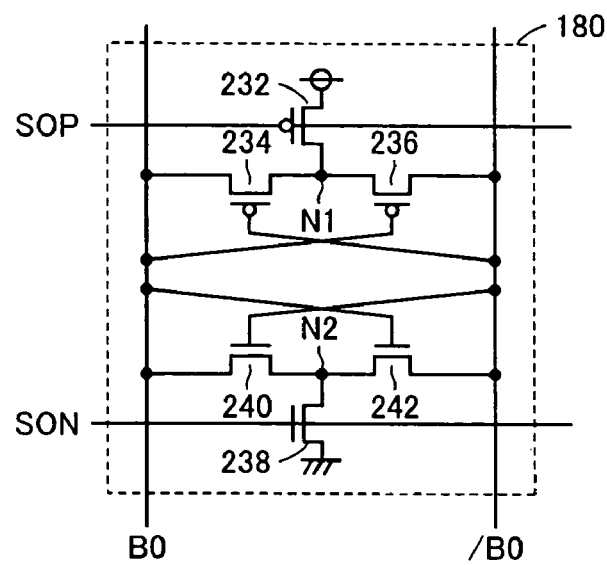
FIG. 8 is a circuit diagram showing a configuration of a sense amplifier in FIG. 7.

FIG. 8 is a circuit diagram showing a configuration of the sense amplifier in FIG. 7.

Referring to FIG. 8, sense amplifier 180 includes a P-channel MOS transistor 232 connected between a power supply node and a node N1 for receiving signal SOP at its gate, a P-channel MOS transistor 234 connected between node N1 and bit line B0 and having its gate connected to bit line /B0, a P-channel MOS transistor 236 connected between node N1 and bit line /B0 and having its gate connected to bit line B0, an N-channel MOS transistor 240 connected between a node N2 and bit line B0 and having its gate connected to bit line /B0, an N-channel MOS transistor 242 connected between node N2 and bit line /B0 and having its gate connected to bit line B0, and an N-channel MOS transistor 238 connected between node N2 and a ground node and receiving signal SON at its gate.

It is noted that sense amplifiers 181–183 in FIG. 7 each have the configuration similar to that of sense amplifier 180 and therefore description thereof will not be repeated.

Figure 9:
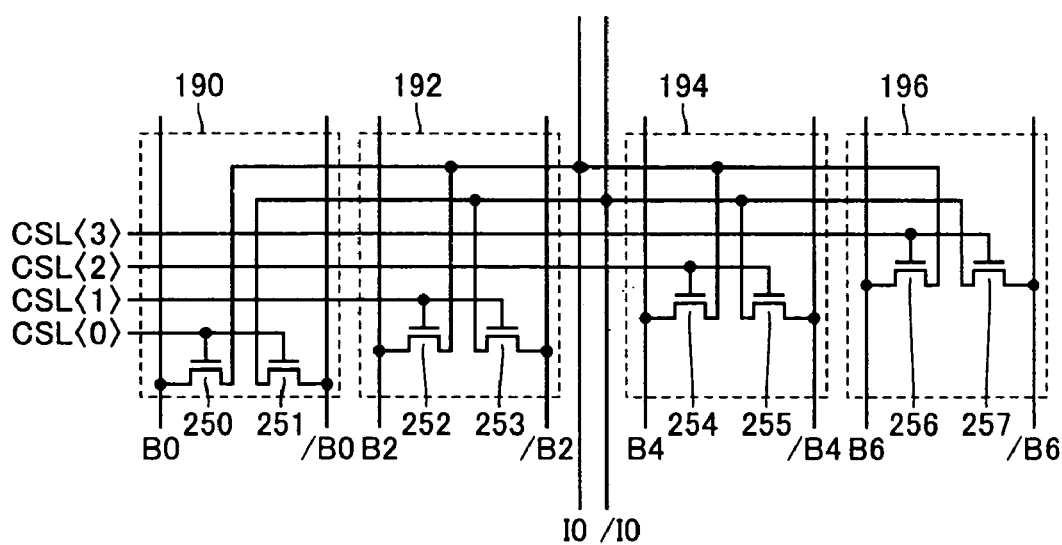
FIG. 9 is a circuit diagram showing a configuration of an I/O gate in FIG. 7.

FIG. 9 is a circuit diagram showing a configuration of the IO gate in FIG. 7.

FIG. 9 shows the configuration of IO gates 190–196. IO gates 190, 192, 194, 196 are provided corresponding to bit lines B0, B2, B4, B6, respectively.

IO gate 190 includes an N-channel MOS transistor 250 connected between bit line B0 and IO line IO for receiving a column select signal CSL<0> at its gate, and an N-channel MOS transistor 251 connected between bit line /B0 and IO line /IO for receiving column select signal CSL<0> at its gate.

IO gate 192 includes an N-channel MOS transistor 252 connected between bit line B2 and IO line IO for receiving a column select signal CSL<1> at its gate, and an N-channel MOS transistor 253 connected between bit line /B2 and IO line /IO for receiving column select signal CSL<1> at its gate.

IO gate 194 includes an N-channel MOS transistor 254 connected between bit line B4 and IO line IO for receiving a column select signal CSL<2> at its gate, and an N-channel MOS transistor 253 connected between bit line /B4 and IO line /IO for receiving column select signal CSL<2> at its gate.

IO gate 196 includes an N-channel MOS transistor 256 connected between bit line B6 and IO line IO for receiving a column select signal CSL<3> at its gate, and an N-channel MOS transistor 257 connected between bit line /B6 and IO line /IO for receiving column select signal CSL<3> at its gate.

Figure 10:
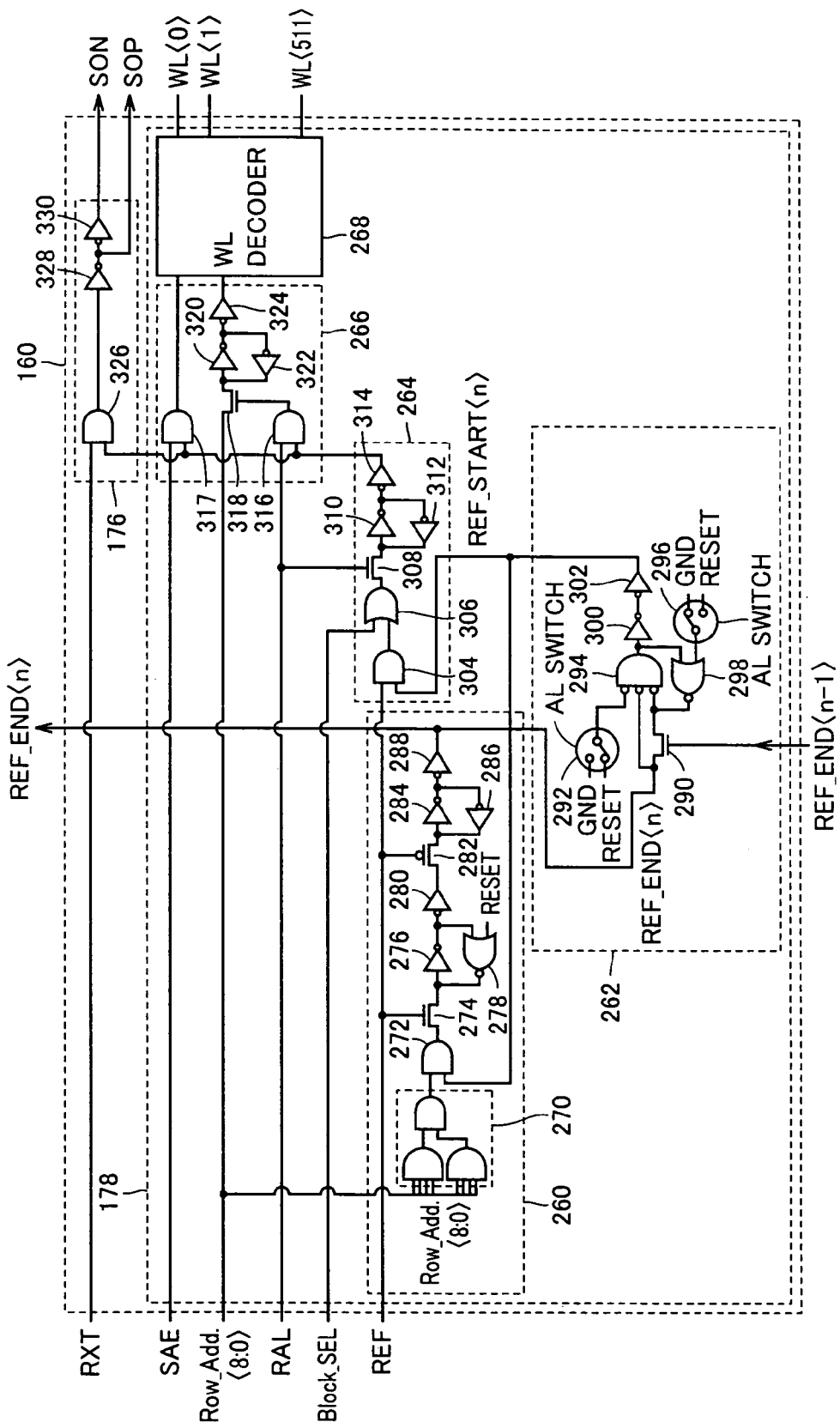
FIG. 10 is a circuit diagram showing a configuration of a control portion in FIG. 7.

FIG. 10 is a circuit diagram showing a configuration of the control portion in FIG. 7.

Referring to FIG. 10, control portion 160 includes a sense amplifier control circuit 176 and a row select circuit 178.

Row select circuit 178 includes an REF_END generation circuit 260, an REF_START generation circuit 262, latch circuits 264, 266, and a WL decoder 268.

REF_END generation circuit 260 includes a decode circuit 270 decoding a row address signal Row_Add<8:0>, an AND circuit 272 receiving the output of decode circuit 270 and a signal REF_START<n>, an N-channel MOS transistor 274 transmitting the output of AND circuit 272 in response to signal REF, an inverter 276 receiving and inverting the output of AND circuit 272 through N-channel MOS transistor 274, and an NOR circuit 278 receiving the output of inverter 276 and signal RESET. The output of NOR circuit 278 is connected to the input node of inverter 276.

REF_END generation circuit 260 further includes an inverter 280 receiving and inverting the output of inverter 276, a P-channel MOS transistor 282 transmitting the output of inverter 280 in response to signal REF, an inverter 284 receiving and inverting the output of inverter 280 through P-channel MOS transistor 282, an inverter 286 receiving and inverting the output of inverter 284 for application to the input node of inverter 284, and an inverter 288 receiving and inverting the output of inverter 284 for outputting a signal REF_END<n>.

REF_START generation circuit 262 includes an aluminum switch 292 set to output signal RESET out of a ground potential and signal RESET, a three-input NOR circuit 294 receiving the output of aluminum switch 292 at a first input node and receiving signal REF_END<n> at a second input node, and an N-channel MOS transistor 290 applying signal REF_END<n> to a third input node of NOR circuit 294 in response to signal REF_END<n−1>.

REF_START generation circuit 262 further includes an inverter 300 receiving the output of NOR circuit 294, an inverter 302 receiving and inverting the output of inverter 300 for outputting signal REF_START<n>, an aluminum switch 296 set to output the ground potential out of the ground potential and signal RESET, and an NOR circuit 298 receiving the output of aluminum switch 296 and the output of NOR switch 294 and having its output connected to the third input node of NOR circuit 294.

Latch circuit 264 includes an AND circuit 304 receiving signal REF and signal REF_START<n>, an OR circuit 306 receiving the output of AND circuit 304 and a signal Block_SEL, an N-channel MOS transistor 308 transmitting the output of OR circuit 306 in response to signal RAL, an inverter 310 receiving and inverting the output of OR circuit 306 through N-channel MOS transistor 308, an inverter 312 receiving and inverting the output of inverter 310 for application to the input node of inverter 310, and an inverter 314 receiving and inverting the output of inverter 310.

Latch circuit 266 includes an AND circuit 316 receiving signal RAL and the output of inverter 314, an N-channel MOS transistor 318 transmitting row address signal Row_Add<8:0> in response to the output of AND circuit 316, an inverter 320 receiving and inverting row address signal Row_Add<8:0> through N-channel MOS transistor 318, an inverter 322 receiving and inverting the output of inverter 320 for application to the input node of inverter 320, an inverter 324 receiving and inverting the output of inverter 320, and an AND circuit 317 receiving the output of inverter 314 and signal SAE. The output of inverter 324 and the output of AND circuit 317 are applied to WL decoder 268. WL decoder 268 activates one of word lines WL<0>–WL<511> based on the applied signal.

It is noted that in order to avoid complication of the drawing, that configuration in latch circuit 266 which corresponds to one bit of row address signals Row_Add<8:0> is representatively shown.

Sense amplifier control circuit 176 includes an AND circuit 326 receiving signal RXT and the output of inverter 314, an inverter 328 receiving and inverting the output of AND circuit 326 for outputting signal SOP, and an inverter 330 receiving and inverting signal SOP for outputting signal SON.

Figure 11:
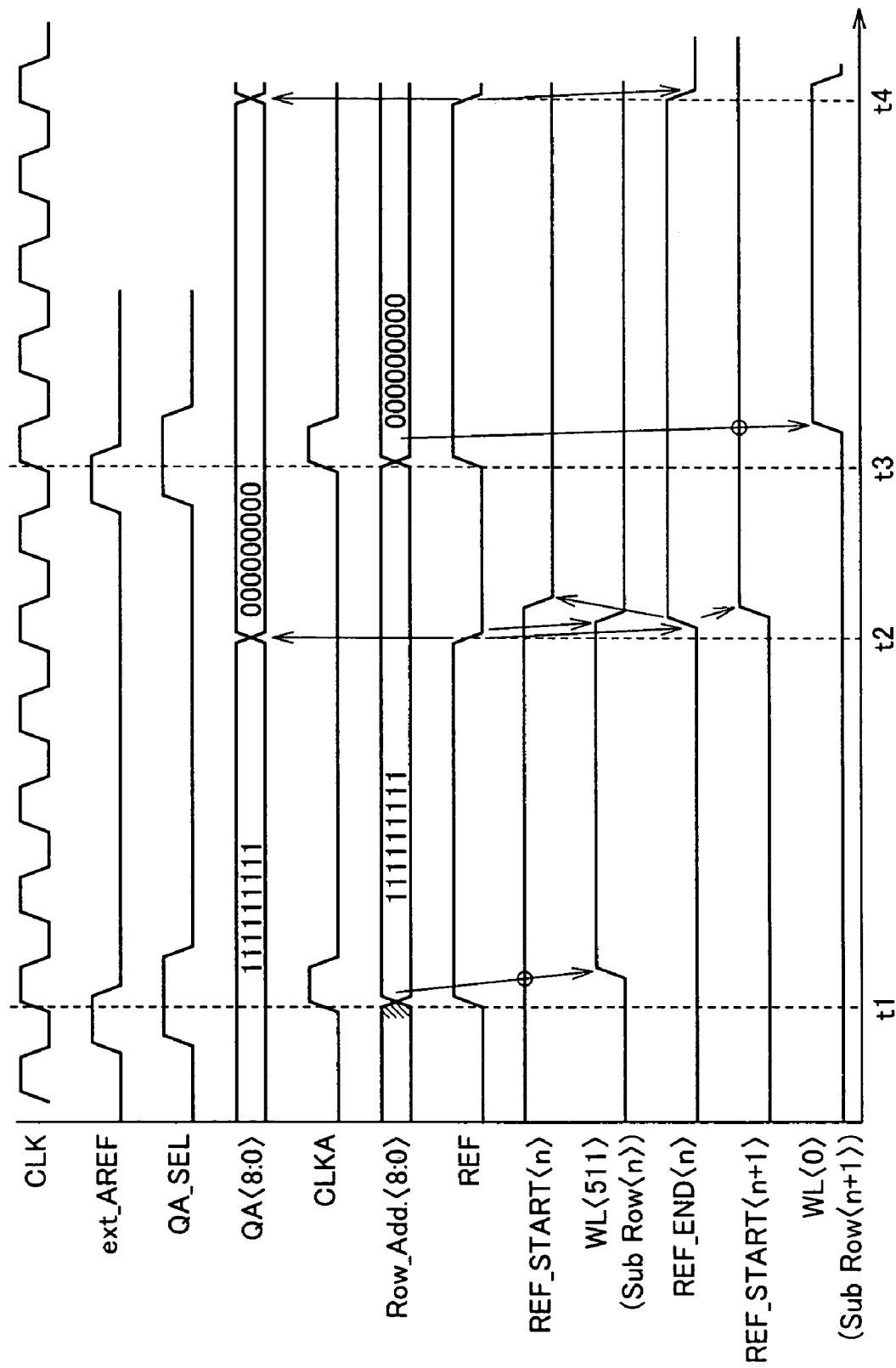
FIG. 11 is an operational waveform diagram illustrating a refresh operation of the semiconductor memory device in the present invention.

FIG. 11 is an operational waveform diagram illustrating a refresh operation of the semiconductor memory device in accordance with the present invention.

In FIG. 11, a refresh start signal REF_START<n> at a sub-block is activated, and after refresh is completed by activation of the last word line WL<511> in the sub-block, a refresh start signal REF_START<n+1> at the next sub-block is activated, and a first word line WL<0> in the next sub-block is activated.

Referring to FIGS. 2 and 11, when receiving a signal indicating refresh externally, for example, an auto-refresh signal ext_AREF at time t1, in central control circuit 2 in FIG. 2, external command input circuit 12 generates signal QA_SEL selecting a refresh address, refresh control signal REF and clock signal CLKA for address input, and row control signal generation circuit 14 generates row-related control signal RCONTSIG.

In response to signal QA_SEL, address selector 18 sends refresh address QA<8:0> to address latch 20, and address latch 20 holds refresh address QA<8:0> as row address Row_Add<8:0> in response to clock signal CLKA. This row address Row_Add<8:0> is transmitted to local row control circuits 22, 24, 26 through the address bus. Of all the sub-blocks to which the refresh address is transferred as a row address, only a sub-block with refresh start signal REF_START being activated takes in the row-related control signal and performs a refresh operation.

The activation timing of the word line and the sense amplifier in refresh occurs using as a trigger a clock at which the command is input, in a manner similar to the normal row activation.

The precharge timing in refresh at time t2 is decided by the delay time at the internal delay stage DP as described with reference to FIGS. 3 and 5. In the example shown in FIG. 11, the rising of signal REF allows the operation similar as the input of row activation command ACT to be started. Thereafter the fall of signal REF after a time period determined by internal delay stage DP allows the precharge operation to be started.

Refresh address counter 16 counts up the refresh address in preparation for the next refresh command. The timing of counting up may come after an address is latched by clock signal CLKA. In the example in FIG. 11, refresh address QA<8:0> is counted up in response to the precharge timing in refresh, that is, the rising of signal REF (time t2). Here, refresh start signal REF_START is transferred from a sub-block to the next sub-block. In FIG. 2, for example, refresh start signal REF_START<n> is activated by refresh end signal REF_END<n−1> indicating that refresh of n-th sub-block 24 is completed. The activated refresh start signal REF_START<n> is reset in REF_START generation circuit 262 in FIG. 10 in response to refresh end signal REF_END<n> that is generated when the refresh is completed in n-th sub-block 24.

Returning to FIG. 10, transmitting of the refresh start signal will be described more specifically.

In FIG. 10, signal RESET is activated upon power-up and the input of the externally applied reset signal, and refresh start signal REF_START<n> and refresh end signal REF_END<n> are reset to "L" state.

Thereafter, when refresh end signal REF_END<n−1> from (n−1)th sub-block 22 is activated to H level, refresh start signal REF_START<n> is activated to H level. Then, when signal REF is activated during a period in which refresh start signal REF_START<n> is at H level, n-th sub-block 24 takes in row-related control signal RCNTSIG and performs a refresh operation.

When the last word line in a sub-block is refreshed, refresh end signal REF_END<n> is activated to H level. In the exemplary circuit shown in FIG. 10, decode circuit 270 detects that all of the refresh row addresses Row_Add<8:0> attain H level, and this result is taken into REF_END generation circuit 260 in response to the fall of signal REF. Refresh end signal REF_END<n> is input to (n+1)th sub-block 26 and refresh start signal REF_START<n> is reset to L level. In other words, at the time of activation of signal REF after the last word line in sub-block 24 is refreshed, the refresh operation in the (n+1)th sub-block is enabled and the refresh of sub-block 24 no longer takes place.

In the circuit shown in FIG. 10, refresh end signal REF_END<n> is activated to H level at the fall of signal REF and is reset to L level at the next fall of signal REF. Refresh end signal REF_END<n>, however, may be a one-shot pulse signal. In this case, the refresh start signal of the next sub-block is generated in response to this one-shot pulse signal.

It is noted that signal Block_SEL in FIG. 10 is generated by decoding an external row address at the time of row activation in accordance with ACT command. The sub-block is selected by signal Block_SEL.

Figure 12:
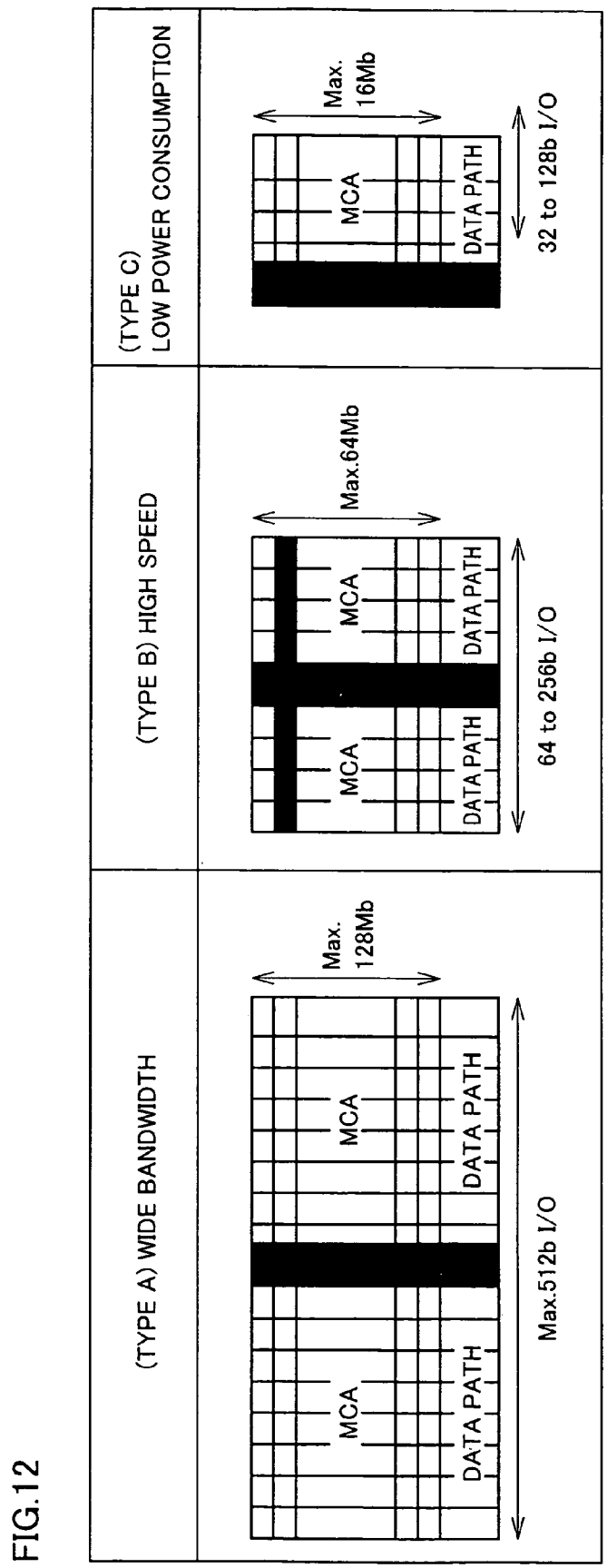
FIG. 12 is a diagram illustrating an exemplary embedded memory core to which the present invention is applied.

FIG. 12 is a diagram illustrating an exemplary memory core to be embedded, to which the present invention is applied.

Referring to FIG. 12, type A is adopted when a bandwidth is wide, type B is adopted for an application where a high-speed operation is required, and type C is adopted when low power consumption is required. In this manner, the semiconductor memory device of the present invention allows a memory capacity to be easily redesigned in order to realize system LSI for a variety of uses. This is realized by arranging a required number of sub-blocks depending on the required memory capacity. Conventionally, the number of bits of the refresh address counter has been changed each time the number of sub-blocks is changed. By contrast, in the present invention, the refresh end signal is delivered from a sub-block to the next sub-block so that the number of bits of the refresh address counter need not be changed.

Figure 13:
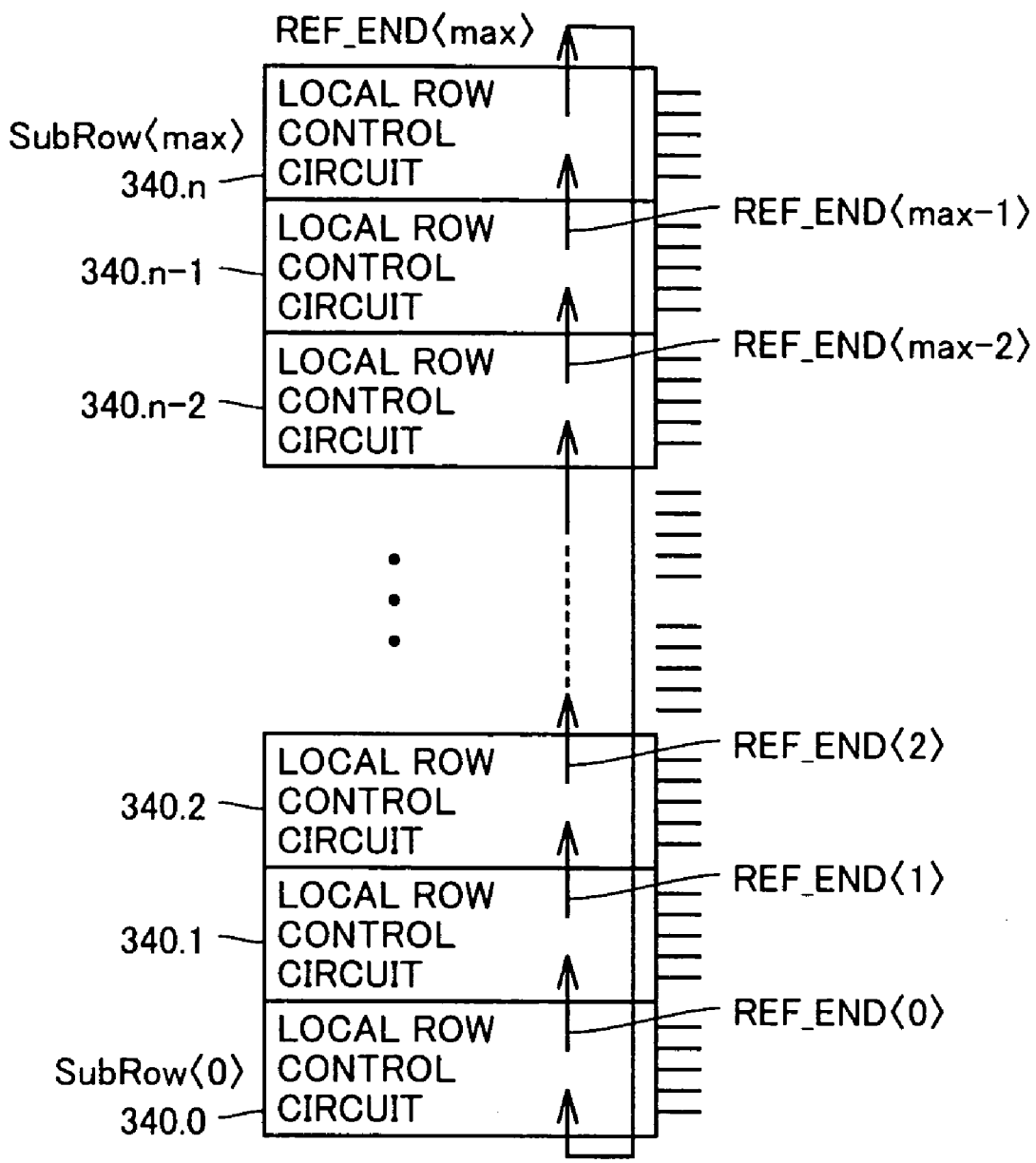
FIG. 13 is a diagram illustrating an operation of refreshing the entire space in a circulating manner only with a refresh counter capable of counting the number of word lines in a sub-block.

FIG. 13 is a diagram illustrating the operation of refreshing the entire space in a circulating manner only with the refresh counter capable of counting the number of word lines in a sub-block.

Referring to FIG. 13, refresh end signal REF_END is transferred in order from a local row control circuit 340.0 provided in the first sub-block SubRow<0> to a local row control circuit 340.n provided in the last sub-block SubRow<max>. Refresh end signal REF_END<max> output from the last local row control circuit 340.n is input to the first local row control circuit 340.0. Therefore, an interconnection may be formed such that the refresh end signal is circulated in all the sub-blocks. The entire memory space can thus be refreshed in a circulating manner.

Upon power-up or the input of the reset signal, refresh start signal REF_START<0> of the first sub-block Sub-Row<0> is set to an activation state and the refresh start signal of the other sub-blocks are reset to an inactivation state.

Specifically, in the first sub-block, aluminum switch 292 in FIG. 10 is re-connected to output ground potential GND and aluminum switch 296 is re-connected to output signal RESET. In the other sub-blocks, aluminum switch 292 is connected to output signal RESET and aluminum switch 296 is connected to output the ground potential, as shown in FIG. 10.

In the prior art disclosed in Japanese Patent Laying-Open No. 3-80493, in the refresh control in which a plurality of memory banks are successively refreshed, a refresh end signal of a bank is successively transferred to another bank and a plurality of memory banks are not refreshed at the same time in order to prevent a large current of the system. By contrast, in accordance with the present invention, the refresh end signal is successively transferred in the control circuits of a plurality of sub-blocks serving as components of a DRAM chip or an embedded memory core. The refresh of the entire space of DRAM chip or embedded memory core is realized by the refresh address counter having the number of bits corresponding to the number of word lines included in a sub-block. In other words, the aforementioned prior art is a technique for preventing a plurality of banks from being refreshed at the same time, unlike the present invention which is aimed to refresh the entire memory space using the refresh counter configured with a small number of bits.

Specifically, the conventional refresh counter is configured with the number of bits corresponding to a refresh cycle required by DRAM chip or embedded memory core. Assuming that embedded memory core has a 2048 refresh cycle (a memory core that requires refresh 2048 times in a refresh time period), for example, a refresh counter of 11 bits is required within a chip. In the aforementioned prior art, as in the conventional case, a refresh address counter having the number of bits corresponding to the refresh cycle is necessary in the refresh in a bank.

Returning to FIG. 1, the refresh operation will be described specifically. With an external refresh command applied to the embedded memory core, the refresh operation is first performed in sub-blocks SBA0, SBB0, SBC0, SBD0 at the same time. When the refresh operation is completed in sub-blocks SBA0, SBB0, SBC0, SBD0 by externally applying the refresh command 512 times, the refresh operation is started in sub-blocks SBA1, SBB1, SBC1, SBD1 with the next refresh command. The refresh is circulated successively in this manner, and the refresh operation proceeds toward sub-blocks SBA3, SBB3, SBC3, SBD3. When the refresh command is externally input 2048 times in total, the refresh operation in sub-blocks SBA3, SBB3, SBC3, SBD3 is completed. Four refresh end signals are transmitted to the respective local row control circuits 8 corresponding to sub-blocks SBA0, SBB0, SBC0, SBD0. The refresh is started again for sub-blocks SBA0, SBB0, SBC0, SBD0 by the input of the next refresh command.

Therefore, a counter that only corresponds to the number of word lines in a sub-block is sufficient for the refresh control in the present invention. In other words, even for a memory core of 2048 refresh cycles, for example, the refresh counter can be formed of an eight-bit counter circuit.

As described above, in accordance with the present invention, the entire memory space can be refreshed only with a counter corresponding to the number of word lines in a sub-block. Since the refresh operation of the memory core having any number of sub-blocks can be realized without changing the refresh counter circuit, the present invention is an optimum circuit for embedded memory that requires the number of sub-blocks to be varied in order to change the capacity.

Since the refresh counter has only to generate an address with the number of bits corresponding to the number of word lines in a sub-block, the number of bits can be reduced, thereby reducing a circuit area occupied by the counter.

[Second Embodiment]

As described with reference to FIG. 13, the refresh end signal is successively shifted to a sub-block to be next refreshed. A loop of a signal transmitting path is formed such that the refresh end signal of the last sub-block is input to the first sub-block. The refresh cycle may easily be changed by only changing the number of sub-blocks included in this loop.

Figure 14:
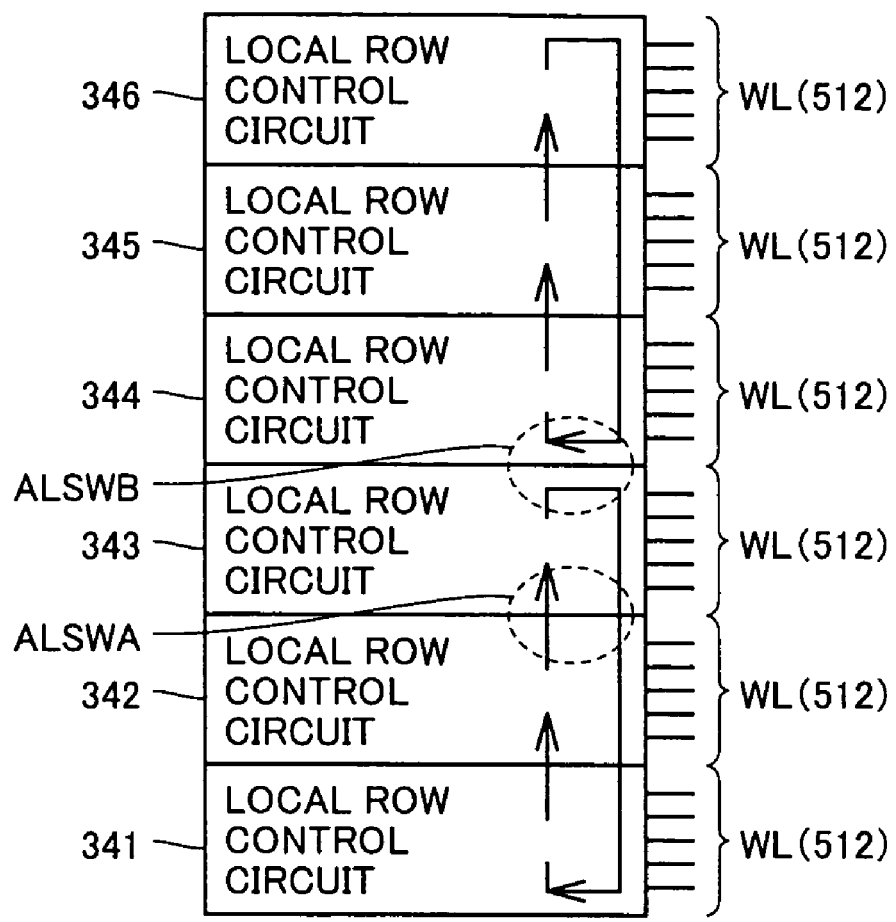
FIG. 14 is a diagram illustrating a loop realizing 1.5 K refresh cycle.

FIG. 14 is a diagram illustrating a loop realizing 1.5K refresh cycle.

Referring to FIG. 14, local row control circuits 341–346 are provided in respective different sub-blocks. Each sub-block includes 512 word lines. Three local row control circuits 341–343 form a loop in which a refresh end signal is circulated. Three local row control circuits 344–346 form a loop in which a refresh end signal is circulated.

The semiconductor memory device employing the present invention can easily realize the refresh cycle that is not the power of two, which is difficult to realize with a circuit modification by changing the number of bits of the refresh counter. Specifically, this can be realized by changing the number of sub-blocks through which the refresh control signal loops. In other words, 1536 (=1.5K) refresh cycle can be realized by forming a loop in which the refresh control signal is circulated, to include three sub-blocks each configured with 512 word lines.

Figure 15:
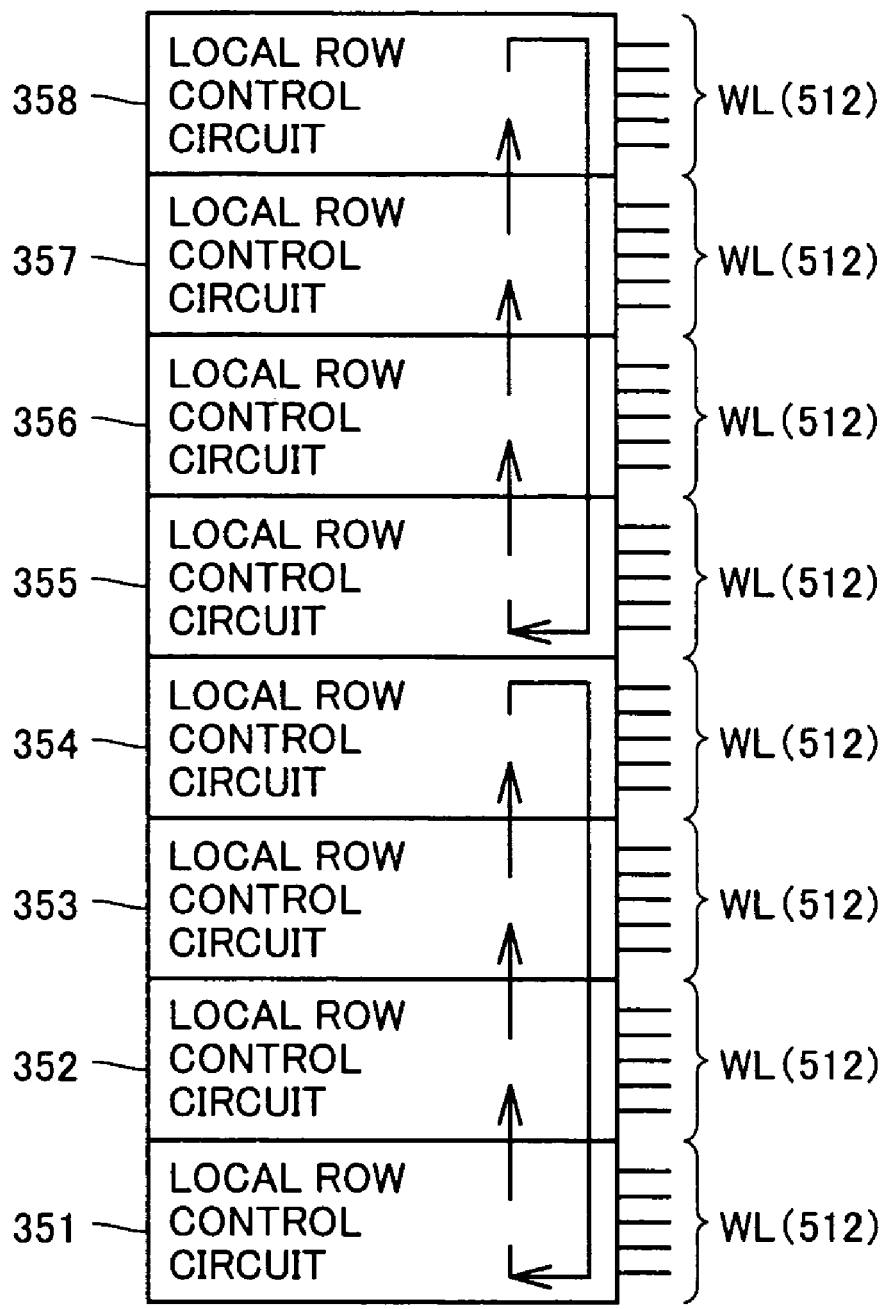
FIG. 15 is a diagram showing an exemplary loop configuration for realizing another refresh cycle.

FIG. 15 is a diagram showing an exemplary loop configuration for realizing another refresh cycle.

Referring to FIG. 15, the refresh end signal is circulated in four local row control circuits 351–354, and the refresh end signal is circulated in four local row control circuits 355–358. In this way, 2K refresh cycle can be realized. Similarly, increased 2560 (=2.5K) refresh cycle can be realized by forming a loop including five local row control circuits. In the present invention, such a wide variety of refresh operations can be realized that could not be realized conventionally.

Figure 16:
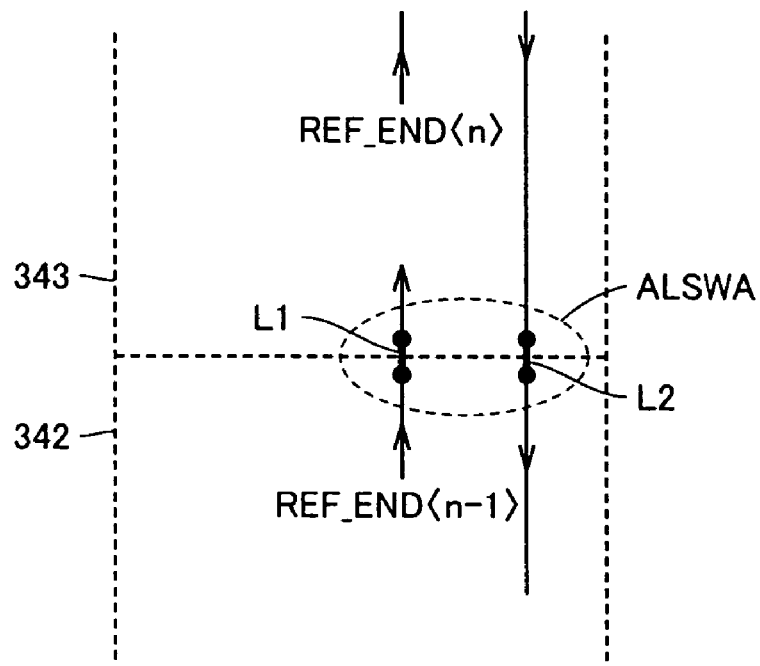
FIG. 16 is a diagram illustrating an aluminum switch ALSWA in FIG. 14.

FIG. 16 is a diagram illustrating aluminum switch ALSWA in FIG. 14.

Referring to FIG. 16, an aluminum switch allows switching of whether the refresh control-signal between sub-blocks is shifted to the next sub-block or is looped to the first sub-block. The aluminum switch refers to a part that is configured to easily change a signal transmitting path by changing only an aluminum mask. In aluminum switch ALSWA, an aluminum interconnection L1 is formed such that signal REF_END<n−1> is transmitted from sub-block 342 to sub-block 343. An aluminum interconnection L2 is formed for a path that sends the signal back to the first sub-block.

Figure 17:
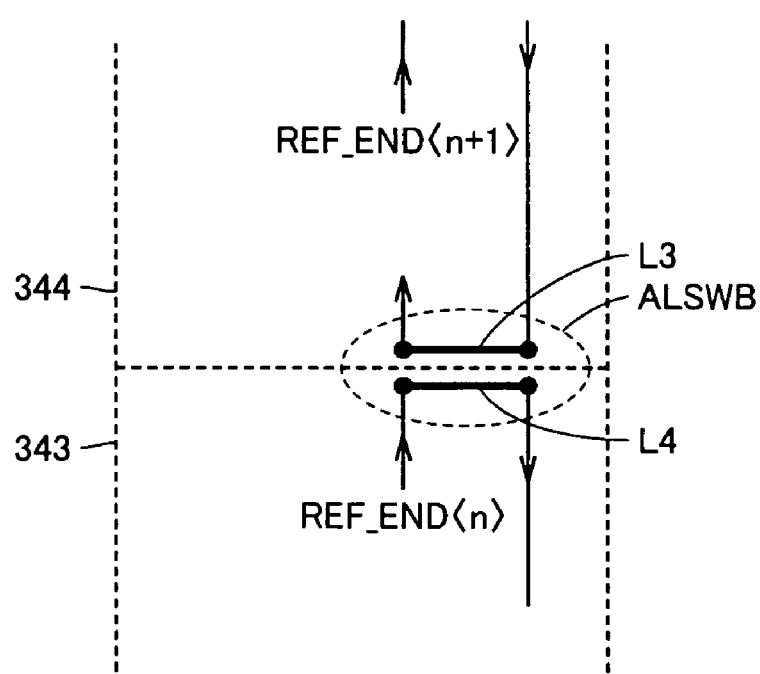
FIG. 17 is a diagram illustrating an aluminum switch ALSWB in FIG. 14.

FIG. 17 is a diagram illustrating aluminum switch ALSWB in FIG. 14.

Referring to FIG. 17, aluminum switch ALSWB is arranged at a boundary part between a sub-block forming a first loop and a sub-block forming a second loop. In the first loop, signal REF_END<n> output from local row control circuit 343 is connected by an aluminum interconnection L4 to a path which transmits the signal to the local row control circuit of the first sub-block.

In the second loop, an aluminum interconnection L3 is formed in local row control circuit 344, and the refresh end signal applied from the sub-block at the last stage in the second loop is input to local row control circuit 344. In this way, the switching can be realized by the aluminum switch, resulting in an easy and quick modification as compared with the conventional circuit modification. In addition, the layout mask number involved with the circuit modification can be reduced, thereby reducing the development cost.

[Third Embodiment]

In addition to the description in the first and second embodiments, partial refresh can be realized by stopping a refresh start signal in a particular sub-block group of a plurality of sub-block groups in which a refresh end signal loops.

Figure 18:
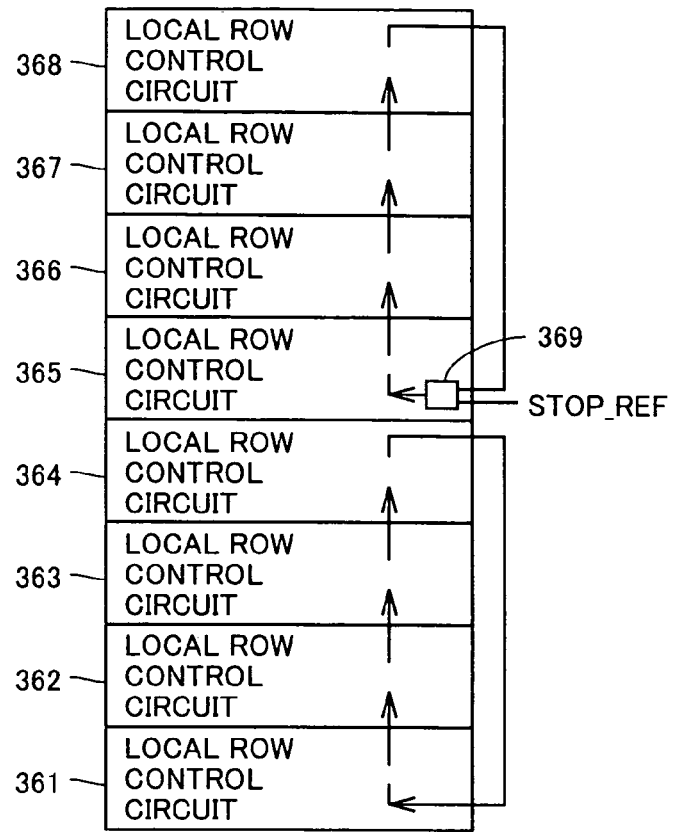
FIG. 18 is a diagram conceptually illustrating a partial refresh control.

FIG. 18 is a diagram conceptually illustrating a partial refresh control.

Referring to FIG. 18, in local row control circuits 361–364, a refresh end signal is successively transmitted for continuous refresh operation. On the other hand, in local row control circuits 365–368, refresh is performed in a circulating manner when refresh stop signal STOP_REF is inactivated. When refresh stop signal STOP_REF is activated, however, local row control circuit 365 does not transmit the refresh end signal to the next stage so that the refresh operation can be stopped. The partial refresh can be realized by providing such a gate circuit 369 in one local row control circuit 365 in a loop that transmits the refresh end signal.

Figure 19:
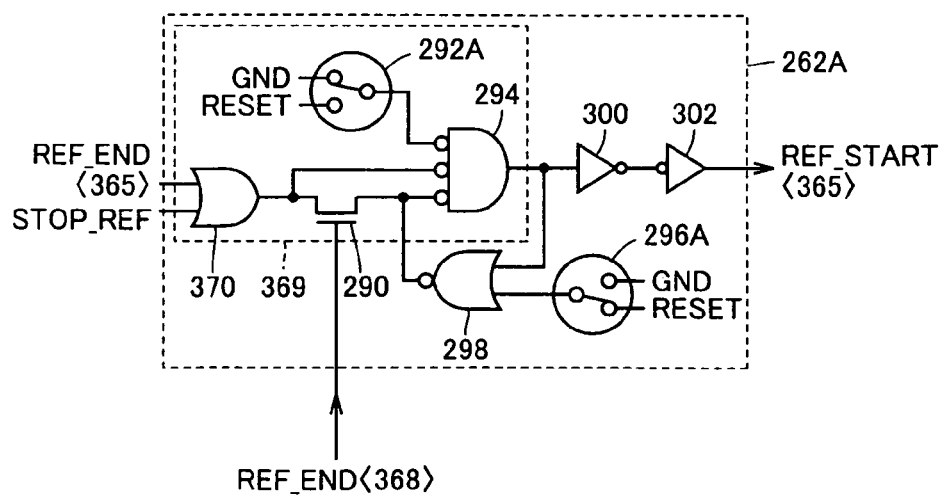
FIG. 19 is a circuit diagram illustrating a specific circuit for realizing the partial refresh.

FIG. 19 is a circuit diagram illustrating a specific circuit for realizing the partial refresh.

A REF_START generation circuit 262A shown in FIG. 19 is provided in local row control circuit 365 in FIG. 18 in place of REF_START generation circuit 262 in FIG. 10.

REF_START generation circuit 262A includes an OR circuit 370 in addition to the configuration of REF_START generation circuit 262 in FIG. 10. REF_START generation circuit 262A includes an aluminum switch 292A set to output ground potential GND, in place of aluminum switch 292, and includes an aluminum switch 296A set to output reset signal RESET, in place of aluminum switch 296.

OR circuit 370 receives refresh stop signal STOP_REF and refresh end signal REF_END<368> applied from local row control circuit 368 in FIG. 18. The output of OR circuit 370 is applied to the second input of NAND circuit 294. The third input of NAND circuit 294 receives the output of OR circuit 370 through N-channel MOS transistor 290. OR circuit 370, N-channel MOS transistor 290, aluminum switch 292A, and NAND circuit 294 correspond to gate circuit 369 in FIG. 18.

As shown in FIG. 19, when refresh stop signal STOP_REF goes to H level, refresh start signal REF_START<365> is fixed to L level.

In other words, gate circuit 369 activates refresh start signal REF_START<365> in response to refresh end signal REF_END<368> from sub memory block 368 and inactivates refresh start signal REF_START<365> in response to refresh stop signal STOP_REF. The refresh operation is stopped in the sub-block group including this sub-block as the refresh start signal is not activated.

As described above, the partial refresh operation can easily be realized by applying the present invention. Furthermore, a variety of partial refresh operations such as a quarter of or a third of the entire memory region can easily be realized. It is noted that while the refresh counter has been shown as an increment type in the embodiments described above, a similar configuration can be realized using a decrement type. While the present invention is a technique optimum for embedded memory, it can be applied to a general-purpose DRAM.

As described above, in accordance with the present invention, the refresh operation in the memory entire space can be realized with only a counter for activating the word lines in a sub-block. Furthermore, the refresh counter circuit can be reduced in area because of the counter having the number of counter bits smaller than that of the conventional refresh counter. In addition, a variety of refresh cycles can be realized only by switching of whether the refresh control signal between sub-blocks is shifted or looped from the last stage to the first stage. Even when the number of sub-blocks is increased or decreased, the same refresh counter can be utilized. Partial refresh can easily be realized by stopping at some point the refresh end signal that is shifted among sub-blocks. Moreover, in the embedded memory requiring a variety of memory spaces, an optimum refresh control operation can be realized, which can shorten a design time period.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising a plurality of memory banks each having rows that can be activated independently of another memory bank, wherein
    a first memory bank of said plurality of memory banks includes first to N-th sub-memory blocks, where N is a natural number greater than two,
    an M-th sub-memory block, where M is a natural number equal to or greater than two and equal to or smaller than N−1, of said first to N-th sub-memory blocks includes
    a first memory cell array including a plurality of memory cells arranged in rows and columns and
    a first local control circuit, in a refresh mode, starting an operation of successively selecting rows of said first memory cell array in response to a first refresh end signal received from an (M−1)th sub-memory block and instructing a refresh start to an (M+1)th sub-memory block when said operation of successively selecting rows ends, and
    said first memory bank further includes a plurality of sense amplifier bands each shared by adjacent two of said first to N-th sub-memory blocks.

2. The semiconductor memory device according to claim 1 wherein
    each of said first to N-th sub-memory blocks includes a plurality of word lines for performing row selection for a memory cell,
    said semiconductor memory device further comprising:
    an address counter generating a refresh address for use in common in said first to N-th sub-memory blocks to select one of said plurality of word lines; and
    an address bus transmitting said refresh address to said first to N-th sub-memory blocks.

3. The semiconductor memory device according to claim 1 wherein
    said M-th sub-memory block includes first to K-th word lines for performing row selection for a memory cell, where K is a natural number equal to or greater than two, and
    said first local control circuit includes a row address decoder activated in response to the first refresh end signal received from the (M−1) sub-memory block for decoding a refresh address to select one of said first to K-th word lines and
    a refresh end detection circuit outputting a second refresh end signal to instruct a refresh start to said (M+1)th sub-memory block when said refresh address corresponds to a refresh end of said K-th word line.

4. The semiconductor memory device according to claim 1 wherein
    said first sub-memory block includes
    a second memory cell array including a plurality of memory cells arranged in rows and columns and
    a second local control circuit, in a refresh mode, starting an operation of successively selecting rows of said second memory cell array in response to a third refresh end signal received from the N-th sub-memory block and instructing a refresh start to a second sub-memory block when said operation of successively selecting rows of said second memory cell array ends.

5. The semiconductor memory device according to claim 4 wherein
    said first local control circuit includes
    a first refresh start control circuit inactivated in response to a reset signal and activated in response to said first refresh end signal received from said (M−1)th sub-memory block for outputting a first refresh start signal, and
    said second local control circuit includes a second refresh start control circuit activated in response to said reset signal and activated in response to said third refresh end signal received from said N-th sub-memory block for outputting a second refresh start signal.

6. A semiconductor memory device comprising a first memory block, wherein
    said first memory block includes a plurality of sub-memory blocks being refreshed in a circulating manner in a refresh mode,
    each of said plurality of sub-memory blocks includes
    a memory cell array including a plurality of memory cells arranged in rows and columns and
    a local control circuit performing an operation of successively selecting rows of said memory cell array in response to an end of a refresh operation in a sub-memory block at a previous stage which precedes by one in refresh-circulating order of said plurality of sub-memory blocks, and
    a refresh cycle period in each of said plurality of memory blocks is determined depending on a number of said sub-memory blocks included in said first memory block.

7. The semiconductor memory device according to claim 6 wherein
    said local control circuit corresponding to at least one of said plurality of sub-memory blocks includes a gate circuit activating a refresh start signal in response to a refresh end signal from a corresponding sub-memory block at a previous stage and inactivating said refresh start signal in response to a refresh stop signal,
    said semiconductor memory device further comprising a second memory block holding a refresh operation irrespective of said refresh stop signal in said refresh mode.

* * * * *